United States Patent
Liu et al.

(10) Patent No.: US 7,513,653 B1
(45) Date of Patent: Apr. 7, 2009

(54) LED LAMP HAVING HEAT SINK

(75) Inventors: Jun Liu, Shenzhen (CN); Yong-Dong Chen, Shenzhen (CN); Shih-Hsun Wung, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/036,275

(22) Filed: Feb. 24, 2008

(30) Foreign Application Priority Data

Dec. 12, 2007 (CN) ........................ 2007 1 0125001

(51) Int. Cl.
*F21V 29/00* (2006.01)
(52) U.S. Cl. ........................ 362/294; 362/218; 362/373
(58) Field of Classification Search .................. 362/96, 362/218, 294, 373, 800, 547; 361/702, 703, 361/704, 709, 717, 720
See application file for complete search history.

(56) References Cited

U.S. PATENT DOCUMENTS

| | | | |
|---|---|---|---|
| 2006/0232974 A1* | 10/2006 | Lee et al. | 362/800 |
| 2007/0159828 A1* | 7/2007 | Wang | 362/294 |
| 2007/0253202 A1* | 11/2007 | Wu et al. | 362/294 |
| 2008/0013318 A1* | 1/2008 | Sun et al. | 362/294 |
| 2008/0175003 A1* | 7/2008 | Tsou et al. | 362/294 |

* cited by examiner

*Primary Examiner*—Y My Quach Lee
(74) *Attorney, Agent, or Firm*—Frank R. Niranjan

(57) ABSTRACT

An LED lamp includes a lamp base, a heat sink mounted on the lamp base and a plurality of LED modules thermally contacting with the heat sink. The lamp base defines a plurality of vents therein. The heat sink includes a central cylinder and a plurality of fins spaced from and surrounding the cylinder. The cylinder defines a through hole therein, which communicates with the vents of the lamp base and cooperates with the vents to form an air passage communicating with ambient air. An included angle is defined between each of the fins and a central axis of the cylinder. The LED modules are mounted on outmost ones of the fins of the heat sink, respectively.

10 Claims, 3 Drawing Sheets

LED LAMP HAVING HEAT SINK

BACKGROUND OF THE INVENTION

1. Field of the Invention

The present invention relates to an LED lamp, and particularly to an LED lamp having a heat sink for dissipating heat from LEDs of the LED lamp.

2. Description of Related Art

Electronic component includes numerous circuits operating at high speed and generating substantive heat. In many applications, it is desirable to employ a heat sink to remove heat from heat-generating electronic components, for example, LED components in an LED lamp, to assure that the components function properly and reliably.

An LED lamp is a type of solid-state lighting device that utilizes light-emitting diodes (LEDs) as a source of illumination. An LED is a device for converting electricity into light by using a theory that, if a current is made to flow in a forward direction through a junction region comprising two different types of semiconductor, electrons and holes are coupled at the junction region to generate a light beam. The LED has an advantage that it is resistant to shock, and has an almost eternal lifetime under a specific condition; thus, the LED lamp is intended to be a cost-effective yet high quality replacement for incandescent and fluorescent lamps.

An LED lamp generally has a limited space therein and requires a plurality of LEDs. Most of the LEDs are driven at the same time, which results in a quick rise in temperature of the LED lamp. Since the limited space in the LED lamp, the heat sink has a restricted heat dissipating area and is unable to remove heat from the LEDs effectively. Operation of the conventional LED lamps thus has a problem of instability because of the rapid buildup of heat.

Besides, since an illumination angle of the light emitted by the LEDs of the conventional lamp is restricted to a radially outward direction of the heat sink, a shadow is generated at a center of the illumination region of the conventional LED lamp, which significantly reduces the usefulness of the conventional LED lamp.

What is needed, therefore, is an LED lamp which has a heat sink with a great heat dissipating capability in a limited space. Furthermore, the heat sink applied in the LED lamp has a special design, whereby the LED lamp can provide an illumination area with an even brightness and no shadow therein.

SUMMARY OF THE INVENTION

An LED lamp includes a lamp base, a heat sink mounted on the lamp base and a plurality of LED modules thermally contacting with the heat sink. The lamp base defines a plurality of vents therein. The heat sink includes a cylinder at a center thereof and a plurality of fins being spaced from and surrounding the cylinder. The cylinder defines a through hole therein, which communicates with the vents of the lamp base and cooperates with the vents to form an air passage communicating with ambient air. An included angle is defined between each of the fins and a central axis of the cylinder. The LED modules contact with outmost ones of the fins of the heat sink, respectively. Each LED module has an elongated printed circuit board and a plurality of LED components mounted on the printed circuit board. The printed circuit board has a first end remote from the lamp base and an opposite second end adjacent to the lamp base. A distance between the central axis of the cylinder and the first end is smaller than that between the central axis of the cylinder and the second end of the printed circuit board.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
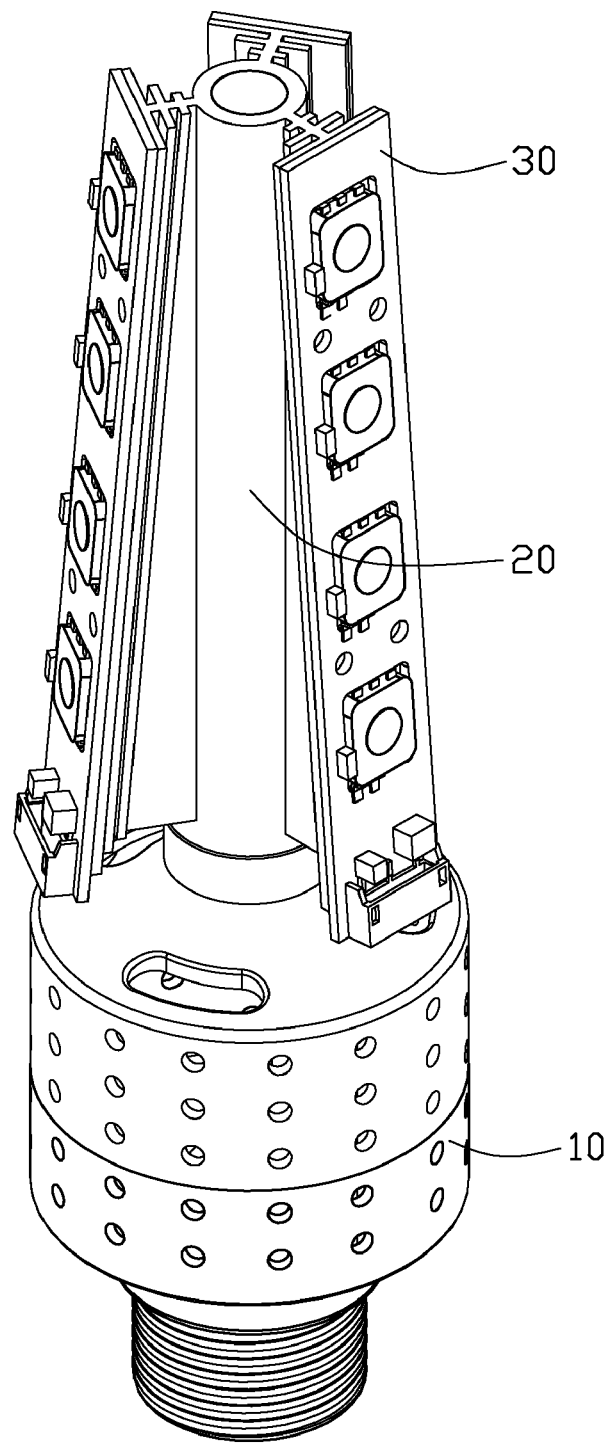
FIG. 1 is an isometric, assembled view of an LED lamp in accordance with a preferred embodiment of the present invention.
Figure 2:
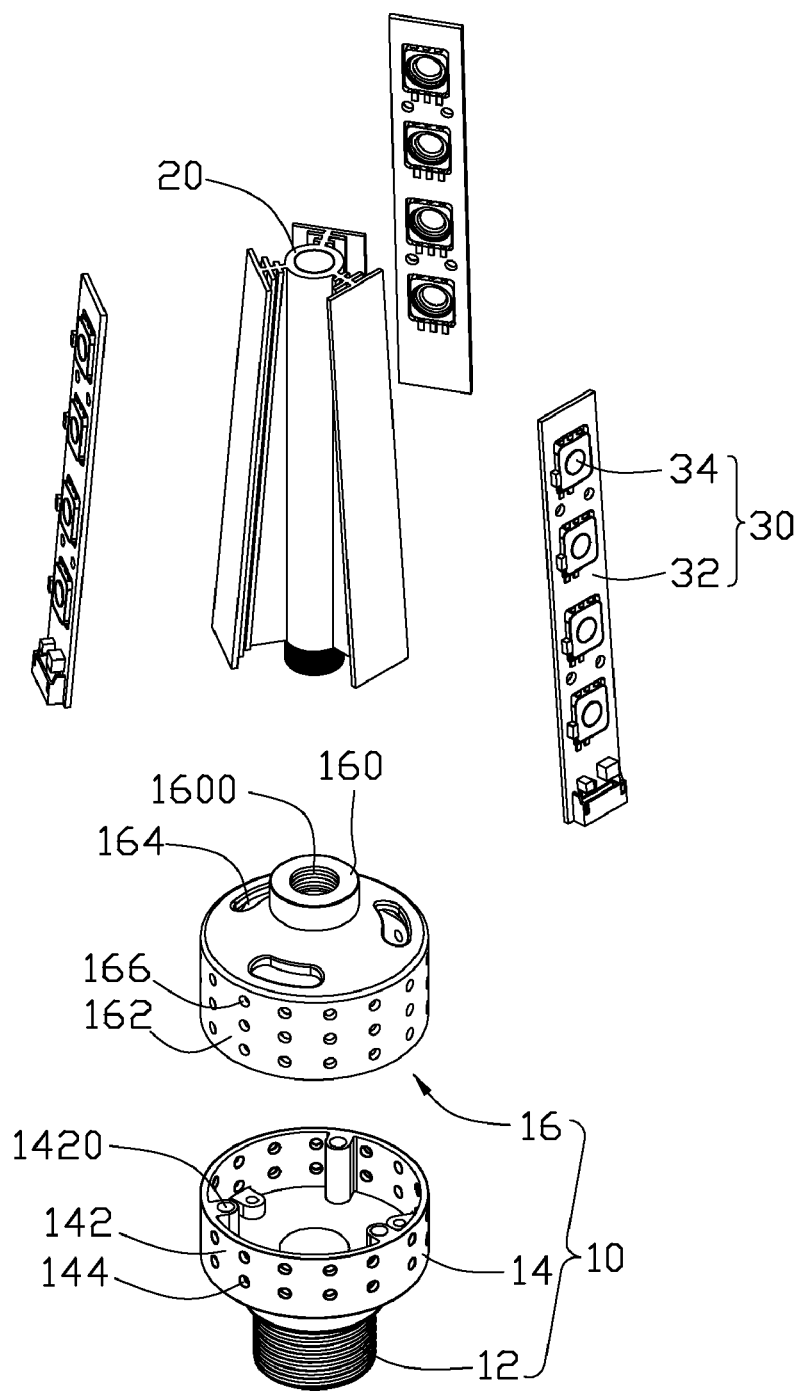
FIG. 2 is an isometric, exploded view of FIG. 1.

Referring to FIGS. 1-2, an LED lamp for a lighting purpose comprises a lamp base 10, a heat sink 20 coupled to the lamp base 10 and a plurality of LED modules 30 thermally attached to a periphery of the heat sink 20.

The lamp base 10 comprises a lamp holder 12, a first cover 14 connecting with the lamp holder 12 and a second cover 16 facing to and engaging with the first cover 14. The lamp holder 12 has screw threads formed on a periphery thereof and has a standardized configuration for fitting in a standardized lamp socket (not shown). The first cover 14 comprises a cone-shaped joining portion (not labeled) coupled with the lamp holder 12 and a first bowl-shaped body 142 extending upwardly from an upper edge of the joining portion. The first bowl-shaped body 142 which has a constant caliber is substantially tube-shaped and symmetrically defines a plurality of vents 144 therein. Three fixing orifices 1420 are evenly defined in an inner rim of the first bowl-shaped body 142 for allowing screws passing therethrough to screw into the second cover 16.

The second cover 16 comprises an annular engaging portion 160 at a top thereof and a second bowl-shaped body 162 extending downwardly from a lower edge of the engaging portion 160. The engaging portion 160 has a diameter smaller than that of the lamp holder 12 and forms screw threads 1600 in an inner wall thereof for engaging with the heat sink 20. An upper portion of the second bowl-shaped body 162 has a caliber increasing gradually from a top to a bottom thereof and defines a plurality of leading orifices 164 therein for allowing lead wires (not shown) to extend from an inner space (not labeled) of the lamp base 10 through the leading orifices 164 to electrically connect with the LED modules 30. A lower portion of the second bowl-shaped body 162 which has a constant caliber is substantially tube-shaped and symmetrically defines a plurality of vents 166 therein. The vents 166, cooperating with the vents 144 in the first bowl-shaped body 142, allow ambient air to flow into the inner space enclosed by the first and second covers 14, 16 of the lamp base 10 and circulate in the LED lamp. Three engaging orifices (not shown) are symmetrically defined in an inner rim of the second bowl-shaped body 162. The three engaging orifices are used for engaging with the screws extending through the fixing orifices 1420 of the first cover 14 to couple the first cover 14 with the second cover 16. The first and second covers 14, 16 cooperatively form an enclosure defining the inner space therein. A rectifier (not shown) for the LED modules 30 can be accommodated in the inner space of the enclosure.

Figure 3:
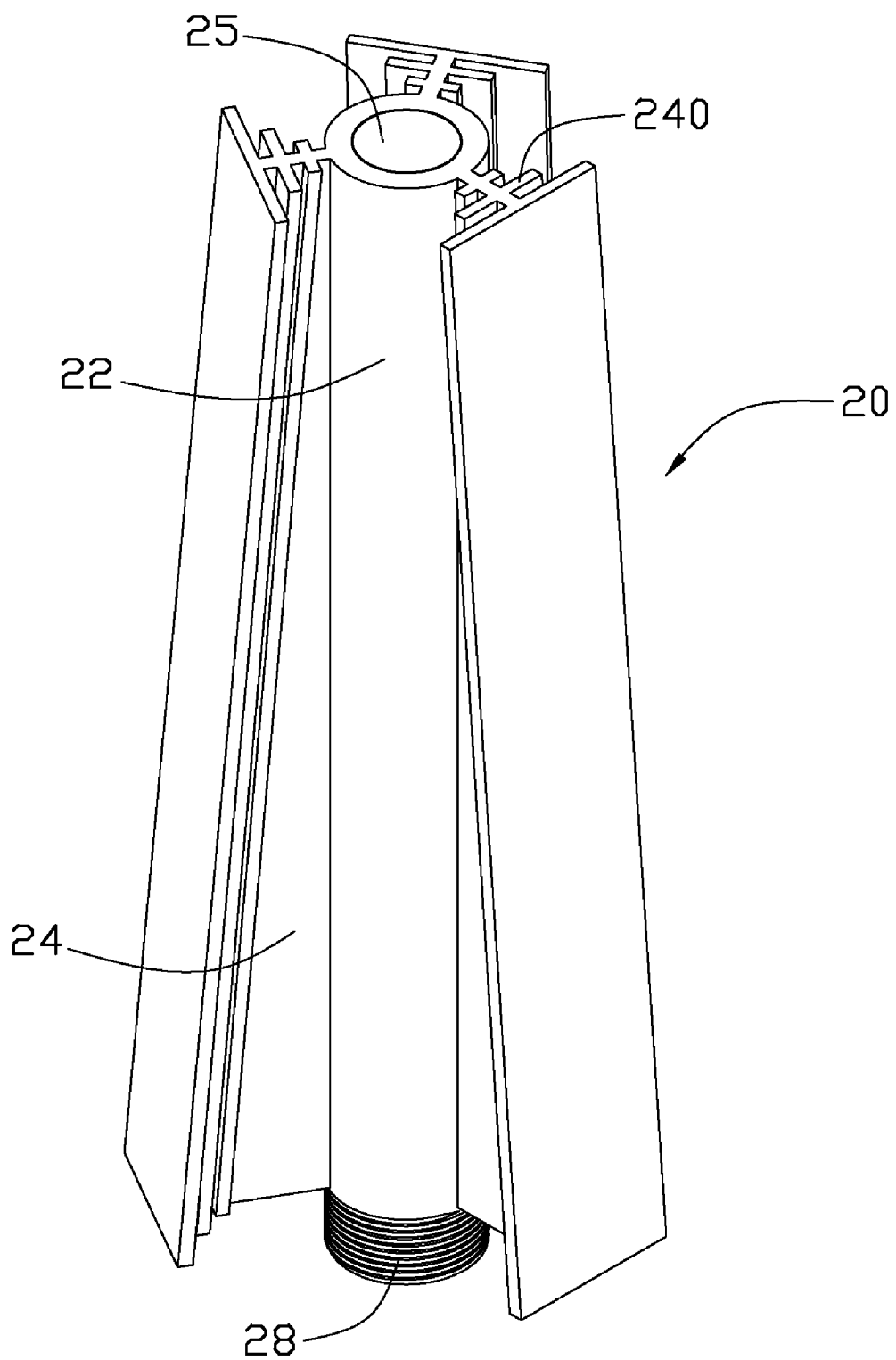
FIG. 3 is an isometric view of a heat sink of the LED lamp of FIG. 1.

As shown in FIG. 3, the heat sink 20 is integrally formed of a one-piece metal with good heat conductivity, such as aluminum or copper. The heat sink 20 has a heat-conductive member at a centre thereof. In this embodiment, the heat-conductive member is an elongated cylinder 22 with a through hole 25 defined therein. The heat sink 20 has a plurality of conducting arms 24 extending radially and outwardly from an outer wall of the cylinder 22. The conducting arms 24 are identical to each other and centrosymmetric relative to a central axis of the cylinder 22. Each of the conducing arms 24 has a radial width and an axial length. The radial width of each conducting arm 24 increases gradually along a direction from a top end of the cylinder 22 to a bottom end of the cylinder 22, i.e., along an axial direction of the cylinder 22. The axial length of each conducting arm 24 is determined and equal to a length of the cylinder 22. A quantity of the conducting arms 24 can be different in an alternative embodiment. In this embodiment, the quantity of the conducting arms 24 is designed to be three. A plurality of pairs of fins 240 are formed on two opposite lateral sides of each of the conducting arms 24. Each pair of the fins 240 extend respectively and perpendicularly from the two opposite lateral sides of a corresponding conducting arm 24 and are symmetrical to each other relative to the corresponding conducting arm 24. Lengths of the fins 240 at a lateral side of each of the conducting arms 24 increase along a direction from the cylinder 22 to a distal end of the corresponding conducting arm 24. Each of the fins 240 is slantwise relative to the cylinder 22 and an included angle is defined between each of the fins 240 and the central axis of the cylinder 22. The distal end of the conducting arms 24 terminates at an inner face of an outermost one of the fins 240. An outer face (not labeled) of each outermost fin 240 is flat and used for thermally contacting with one of the LED modules 30, when the LED module 30 is mounted on the outer face. An annular fixing part 28 extends downwardly and vertically from a bottom edge of the cylinder 22 and forms screw thread thereon for screwing into the engaging portion 160 of the second cover 16 to mount the heat sink 20 on the lamp base 10.

Also referring to FIG. 2, the LED modules 30 each comprise an elongated printed circuit board 32 with a size substantially identical to that of the outmost fin 240 of the heat sink 20. A plurality of LED components 34 (four in this embodiment) is mounted in a line on each of the printed circuit boards 32 along a length of the printed circuit board 32.

In assembly of the LED lamp, the screws pass through the fixing orifices 1420 of the first cover 14 of the lamp base 10 to screw into the second cover 16 of the lamp base 10; the first and second covers 14, 16 are thus assembled together. The heat sink 20 is mounted to the second cover 16 of the lamp base 10 by the fixing part 28 at the bottom of the heat sink 20 screwing downwardly into the engaging portion 160 of the second cover 16. The LED modules 30 are respectively attached to the outer faces of the outmost fins 240 of the heat sink 20 in a thermal conductive relationship therewith. Each printed circuit board 32 has a top end (not labeled) remote from the lamp base 10 and a bottom end (not labeled) adjacent to the lamp base 10. A distance between the top end and the central axis of the cylinder 22 is smaller than that between the bottom end of the printed circuit board 32 and the central axis of the cylinder 22.

In use of the LED lamp, the enclosure formed by the first and second covers 14, 16 and the through hole 25 in the cylinder 22 of the heat sink 20 communicate with each other and cooperate to form an air passage in the LED lamp. Ambient air can flow into the air passage in the LED lamp through the vents 144, 166 of the first and second covers 14, 16 of the lamp base 10 and exit the air passage from a top of the cylinder 22 of the heat sink 20. Alternatively, ambient air can enter the air passage through the top end of the cylinder 22 and exit therefrom from the vents 144, 166. An air circulation is thus formed wherein air circulates between the air passage in the LED lamp and ambient air around the LED lamp. When the LED modules 30 are activated, heat generated by the LED components 34 is absorbed by the outmost fins 240 of the heat sink 20 and then evenly distributed to the whole heat sink 20 via the conducting arms 24 of the heat sink 20. The heat of the heat sink 20 is finally removed by the airflow circulating in the air passage and the ambient air.

Since the LED modules 30 are mounted on the outmost fins 240 which are slantwise to the cylinder 22, the light emitted by the LED modules 30 can radiate along, in addition to the radially outward direction, also an upward direction towards a top of the LED lamp. Therefore, the problem of the conventional LED lamp which has a shadow in a center of the illumination region caused by the central heat sink thereof can be overcome by the LED lamp in accordance with the present invention. In the conventional LED lamp, the outmost fins of the central heat sink are extended parallel to the central axis of the cylinder of the heat sink.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp, comprising:
   a lamp base defining a plurality of vents therein;
   a heat sink mounted on the lamp base and comprising a cylinder at a centre thereof and a plurality of fins being spaced from and surrounding the cylinder, the cylinder having a through hole defined therein, which communicates with the vents of the lamp base and cooperates with the vents to form an air passage communicating with ambient air, an included angle defined between each of the fins and a central axis of the cylinder; and
   a plurality of the LED modules thermally contacting with outmost ones of the fins of the heat sink, respectively;
   wherein the heat sink has a plurality of conducting arms extending outwardly from an outer wall of the cylinder, the fins are formed at two lateral sides of each of the conducting arms, and a height of the each of the conducting arms from the outer wall of the cylinder increases gradually along an axial direction of the cylinder.

2. The LED lamp as claimed in claim 1, wherein the fins of the each of the conducting arms are perpendicular to the each of the conducting arms, and increase in length outwardly from the cylinder to a distal end of the each of the conducting arms.

3. The LED lamp as claimed in claim 2, wherein the distal end of the each of the conducting arms terminates at an inner face of an outmost one of the fins of the each of the conducting arms, and an outer face of the outmost one of the fins is flattened on which a corresponding LED module is mounted.

4. The LED lamp as claimed in claim 1, wherein the lamp base comprises a lamp holder, a first cover connecting with the lamp holder and a second cover facing to and engaging with the first cover.

5. The LED lamp as claimed in claim 4, wherein the first and second covers cooperatively form an enclosure defining an inner space therein, the vents being defined in the enclosure, the inner space and the vents communicating with the through hole of the heat sink.

6. The LED lamp as claimed in claim 4, wherein the heat sink has a fixing part extending downwardly from a bottom of the cylinder thereof, and the second cover forms an annular engaging portion at a top thereof for engaging with the fixing part.

7. A heat sink adapted for cooling LEDs, comprising:
a tube-shaped heat-conducting member having a central axis;
a plurality of arms extending outwardly from an outer side of the heat-conducting member;
a plurality of fins connected to outer ends of the arms, respectively, each fin having a flat outer surface adapted for thermally connecting with the LEDs; and
a plurality of additional fins extending from the arms and located between the fins and the heat-conducting member;
wherein each of the arms has a length along a radial direction which is perpendicular to the central axis of the heat-conducting member, and the length of the each of the arms increases gradually from a top to a bottom of the heat-conducting member.

8. The heat sink as claimed in claim 7, wherein a plurality of spaces are defined between the heat-conducting member, the arms and the fins and extend through top and bottom of the heat sink.

9. The heat sink as claimed in claim 7, wherein lengths of the additional fins increase outwardly from the cylinder to distal ends of the arms.

10. An LED lamp comprising:
a lamp base adapted for connecting with a lamp socket, defining an inner space and a plurality of vents communicating the inner space with an ambient air;
a heat sink mounted on the lamp base, having a central cylinder defining a central hole communicating with the inner space, a plurality of fins connecting with the central cylinder and surrounding the central cylinder;
a plurality of LED modules mounted to the fins, respectively, each LED module having a printed circuit board and a plurality of LED components mounted on the printed circuit board, the printed circuit board having a first end remote from the lamp base and an opposite second end adjacent to the lamp base, a distance between a central axis of the central cylinder and the first end is smaller than that between the central axis of the central cylinder and the second end of the printed circuit board;
wherein the heat sink has a plurality of conducting arms extending outwardly from an outer wall of the central cylinder, the fins are formed at two lateral sides of each of the conducting arms, and a height of the each of the conducting arms from the outer wall of the central cylinder increases gradually from the first end to the opposite second end of the printed circuit board.

* * * * *